US012713859B2

(12) United States Patent
Chen et al.

(10) Patent No.: US 12,713,859 B2
(45) **Date of Patent: *Aug. 18, 2026**

(54) WAFER THINNING METHOD HAVING FEEDBACK CONTROL

(71) Applicant: TAIWAN SEMICONDUCTOR MANUFACTURING COMPANY, LTD., Hsinchu (TW)

(72) Inventors: Yuan-Hsuan Chen, Tainan City (TW); Kei-Wei Chen, Tainan City (TW); Ying-Lang Wang, Tien-Chung Village (TW); Kuo-Hsiu Wei, Tainan City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 514 days.

This patent is subject to a terminal disclaimer.

(21) Appl. No.: 18/356,388

(22) Filed: Jul. 21, 2023

(65) Prior Publication Data

US 2023/0360919 A1 Nov. 9, 2023

Related U.S. Application Data

(60) Continuation of application No. 16/863,632, filed on Apr. 30, 2020, now Pat. No. 11,728,172, which is a (Continued)

(51) Int. Cl.

| | |
|---|---|
| ***H10P 52/40*** | (2026.01) |
| ***B24B 37/005*** | (2012.01) |
| ***B24B 37/04*** | (2012.01) |
| ***B24B 49/00*** | (2012.01) |
| ***B24B 49/04*** | (2006.01) |
| ***B24B 49/05*** | (2006.01) |
| ***H10P 52/00*** | (2026.01) |
| ***H10P 74/00*** | (2026.01) |
| ***H10P 74/20*** | (2026.01) |

(52) U.S. Cl.

CPC .......... *H10P 52/402* (2026.01); *B24B 37/005* (2013.01); *B24B 37/04* (2013.01); *B24B 49/00* (2013.01); *B24B 49/04* (2013.01); *B24B 49/05* (2013.01); *H10P 52/00* (2026.01); *H10P 74/203* (2026.01); *H10P 74/23* (2026.01)

(58) Field of Classification Search

CPC ........ H10P 52/402; B24B 49/04; B24B 49/05

See application file for complete search history.

(56) References Cited

U.S. PATENT DOCUMENTS 5,963,821 A 10/1999 Kai
6,090,688 A 7/2000 Ogawa (Continued)

*Primary Examiner* — Bac H Au
(74) *Attorney, Agent, or Firm* — Hauptman Ham, LLP

(57) ABSTRACT

A method of thinning a wafer includes measuring an initial thickness of the wafer. The method further includes calculating a polishing time using the initial thickness. The method further includes polishing the wafer for a first duration equal to the polishing time to obtain a polished wafer. The method further includes measuring a polished thickness of the polished wafer. The method further includes calculating an etching time using the polished thickness. The method further includes etching the polished wafer for a second duration equal to the etching time to obtain an etched wafer, wherein the wafer has a total thickness variation of less than or equal to 0.15 μm after etching the polished wafer.

20 Claims, 5 Drawing Sheets

Related U.S. Application Data division of application No. 13/371,046, filed on Feb. 10, 2012, now Pat. No. 10,643,853.

(56) References Cited

U.S. PATENT DOCUMENTS

| | | | |
|---|---|---|---|
| 6,191,007 | B1 | 2/2001 | Matsui et al. |
| 6,213,844 | B1 | 4/2001 | Lenkersdorfer |
| 6,213,848 | B1 | 4/2001 | Campbell |
| 6,431,964 | B1 | 8/2002 | Ishikawa |
| 6,514,861 | B1 | 2/2003 | Yang |
| 6,905,957 | B2 | 6/2005 | Kakita |
| 6,939,198 | B1 | 9/2005 | Swedek et al. |
| 7,008,875 | B2 | 3/2006 | Birang et al. |
| 7,333,875 | B2 | 2/2008 | Chuang |
| 7,366,575 | B2 | 4/2008 | Ring et al. |
| 8,005,634 | B2 | 8/2011 | Shanmugasundram et al. |
| 2002/0052166 | A1 | 5/2002 | Kojima |
| 2002/0197745 | A1 | 12/2002 | Shanmugasundram |
| 2003/0045098 | A1 | 3/2003 | Verhaverbeke |
| 2005/0014347 | A1 | 1/2005 | Tomita |
| 2005/0032459 | A1 | 2/2005 | Surana et al. |
| 2005/0208876 | A1 | 9/2005 | Chen |
| 2005/0245169 | A1 | 11/2005 | Morisawa |
| 2007/0082490 | A1 | 4/2007 | Hu et al. |
| 2007/0096305 | A1 | 5/2007 | Fuergut |
| 2007/0123046 | A1 | 5/2007 | Ravid et al. |
| 2007/0156274 | A1 | 7/2007 | Dierks |
| 2008/0146120 | A1 | 6/2008 | Ravid et al. |
| 2010/0093259 | A1 | 4/2010 | Lee et al. |
| 2010/0120331 | A1 | 5/2010 | Carlsson et al. |
| 2010/0144119 | A1 | 6/2010 | Kusaba |
| 2011/0281501 | A1 | 11/2011 | Qian et al. |
| 2012/0129431 | A1 | 5/2012 | Hui et al. |

WAFER THINNING METHOD HAVING FEEDBACK CONTROL

PRIORITY CLAIM

The present application is a continuation of U.S. application Ser. No. 16/863,632, filed Apr. 30, 2020, now U.S. Pat. No. 11,728,172, issued Aug. 15, 2023, which is a divisional of U.S. application Ser. No. 13/371,046, filed Feb. 10, 2012, now U.S. Pat. No. 10,643,853, issued May 5, 2020, the entire contents of which are hereby incorporated by reference.

BACKGROUND

Optical sensors, such as backside illumination sensors, are used in a variety of camera arrangements and are sometimes used in low light environments. A backside illumination sensor relies on passing light through a wafer layer for sensing incident light. However, conventional techniques of layer thinning form a layer having significant thickness variation across the layer. Variations in the layer thickness cause uneven propagation of light through the layer, which in turn causes distortion in the image collected by the optical sensor.

In some arrangements, a chemical and mechanical polishing (CMP) device polishes a wafer layer for a constant polishing time. An etching process removes additional layer material as well as cracks and crystal dislocations introduced during the CMP process to thin the wafer layer to a desired thickness. As the etching duration increases beyond the time needed to remove the cracks and dislocations, the etching process begins to increase non-uniformity in the wafer layer thickness.

A material removal rate for a CMP device is affected by many variables which are different from device to device and between batches of wafers. For example, rotational speed of a platen and a chuck, misalignment between axes of rotation of the platen and the chuck, a force pressing the wafer against the pad, etc. impact the material removal rate of a CMP device. In addition, variations in a concentration of the slurry and wear patterns on the pad impact the material removal rate for each batch of wafers. Some techniques fail to account for these variables and instead use a constant material removal rate. Some techniques, using a constant material removal rate, achieve a total thickness variation of about 0.2 μm on the surface of the wafer layer.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are of course, merely examples and are not intended to be limiting.

Figure 1A:
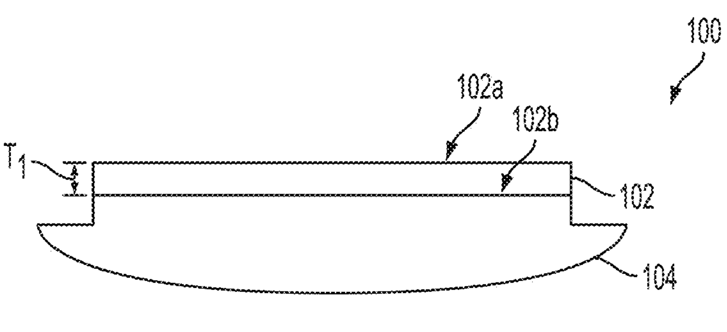
FIGS. 1A-1C are side views of a wafer assembly at various stages of development according to one or more embodiments.

FIG. 1A is a side view of a wafer assembly 100 prior to a chemical and mechanical polishing (CMP) process according to one or more embodiments. A wafer layer 102 is supported by a carrier 104 and has an initial thickness, $T_1$. Wafer layer has an exposed surface **102*a* furthest from carrier 104 and a bonded surface 102*b* closest to carrier 104**.

In some embodiments, wafer layer 102 is attached to carrier 104 by a wax between bonded surface **102*b* and carrier 104. In some embodiments, wafer layer 102 is attached to carrier 104 by an adhesive or other suitable form of removable bonding material between bonded surface 102*b* and carrier 104**.

In some embodiments, wafer layer 102 is a semiconductor such as silicon, germanium, carbide or other suitable semiconductor material. In some embodiments, wafer layer 102 is subjected to various material removal processes to reduce the thickness to the initial thickness, $T_1$, as shown in FIG. 1A. In some embodiments, the material removal process includes grinding, etching, edge trimming, or other material removal process. The thickness of wafer layer 102 is measured from exposed surface **102*a*, to bonded surface 102*b* at various locations across wafer layer 102**. In some embodiments, the initial thickness, $T_1$, is about 4.0 μm. In some embodiments, the initial thickness, $T_1$, ranges from about 3.8 μm to about 4.3 μm. This range, in some embodiments, is narrower, e.g., from 3.8 μm to 4.3 μm.

In some embodiments, wafer layer 102 includes at least one radiation sensing element formed in bonded surface **102*b*. In some embodiments, the at least one radiation sensing element is a photodiode. In some embodiments, the at least one radiation sensing element is a photogate, reset transistor, source follower transistor, transfer transistor, or other suitable light detecting element. In some embodiments, wafer layer 102 has a plurality of radiation sensing elements. In some embodiments, wafer layer 102 comprises a single radiation sensing element. In some embodiments, wafer layer 102** comprises an array of radiation sensing elements.

In some embodiments, an interconnect structure, including lines and vias configured to electrically connect to the at least one radiation sensing element, is between wafer layer 102 and carrier 104. In some embodiments, the interconnect structure includes circuitry configured to analyze signals from the at least one radiation sensing element.

Figure 1B:
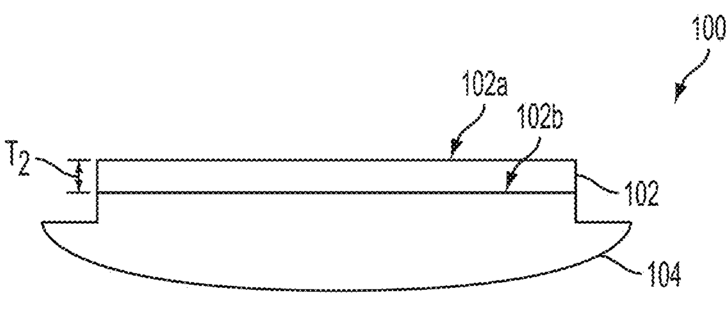

FIG. 1B is a side view of wafer assembly 100 following the CMP process and before an etching process. Wafer layer 102 remains attached to carrier 104. Wafer layer 102 has a polished thickness, $T_2$, less than the initial thickness, $T_1$. In some embodiments, polished thickness, $T_2$, is about 2.6 μm. In some embodiments, polished thickness, $T_2$, ranges from about 2.3 μm to about 2.9 μm. This range, in some embodiments, is narrower, e.g., from 2.3 μm to 2.9 μm.

Figure 1C:
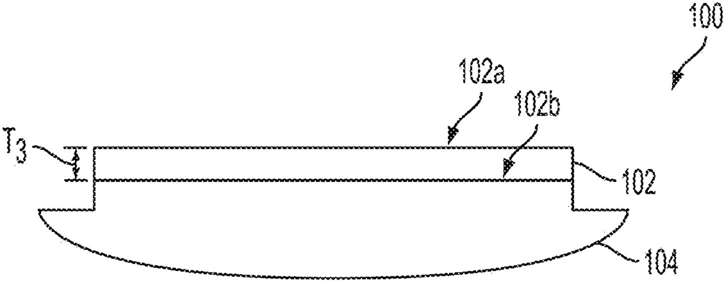

FIG. 1C is a side view of a wafer assembly 100 following the etching process. Following etching process, wafer layer 102 remains attached to carrier 104. Wafer layer 102 has an etched thickness, $T_3$, less than polished thickness, $T_2$. In some embodiments, etched thickness, $T_3$, is about 2.15 μm. In some embodiments, etched thickness, $T_3$, ranges from about 2.1 μm to about 2.2 μm. This range, in some embodiments, is narrower, e.g., from about 2.1 μm to 2.2 μm.

Following the etching process, in some embodiments, wafer layer 102 has a total thickness variation less than about 0.15 μm. In some embodiments, wafer layer 102 has a total thickness variation ranging from about 0.10 μm to about 0.15 μm. This range, in some embodiments, is narrower, e.g., from 0.10 μm to 0.15 μm.

The thickness of wafer layer 102 is measured from exposed surface 102*a*, to bonded surface 102*b* at various locations across wafer layer 102. The difference between a maximum thickness value and a minimum thickness value is the total thickness variation. Total thickness variation is a measure of surface uniformity. Decreasing total thickness variation increases the uniformity of the exposed surface 102*a*

In some embodiments, wafer layer 102 is used to form a sensing product, e.g., an optical sensor, suitable for use in a detector or a camera. These and other products, e.g., a backside illumination sensor, comprise wafer layer 102 optionally having a total thickness variation less than or equal to about 0.15 μm, which makes it possible to reduce the amount of distortion of light passing through wafer layer 102. A surface with poor uniformity will act to scatter light incident upon the surface. Scattering of incident light causes degradation in the resolution of an image captured. Reducing the total thickness variation results in higher image quality. If the sensing product is in a camera, a total thickness variation equal to about 0.15 μm makes it possible to produce higher resolution images than light in a camera having an incident surface having a larger total thickness variation.

Figure 2:
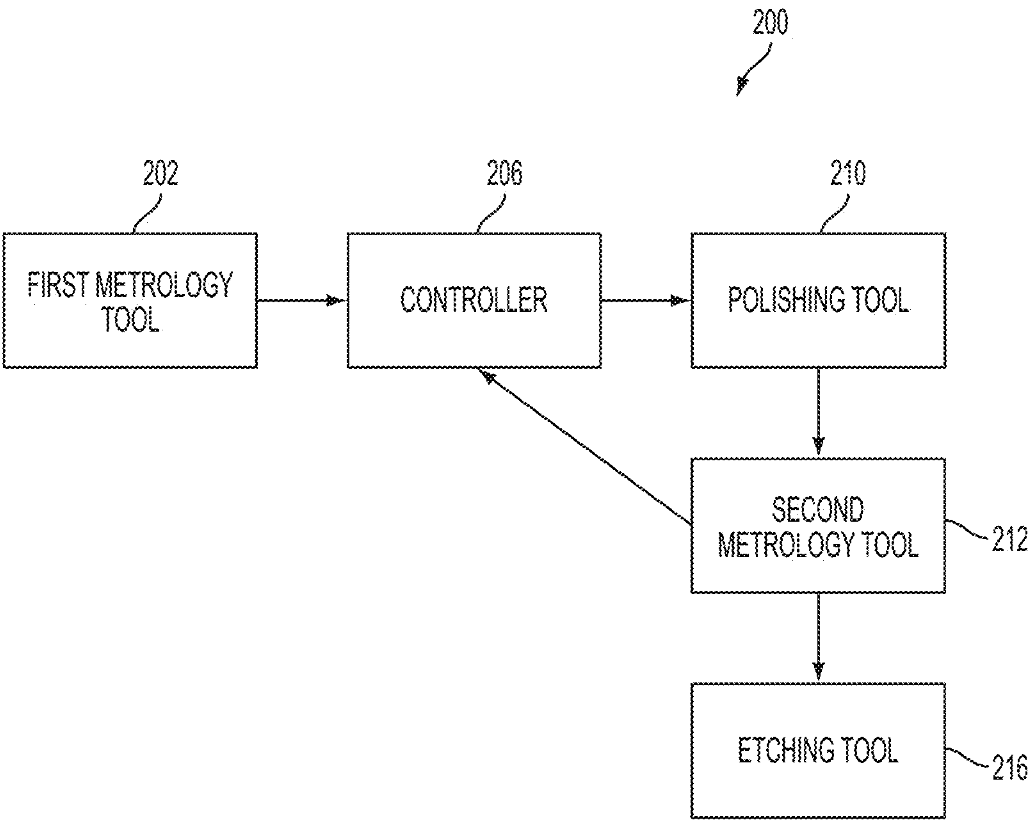
FIG. 2 is a schematic diagram of a wafer thinning apparatus having feedback control according to one or more embodiments.

FIG. 2 is a schematic diagram of a wafer thinning apparatus 200 according to some embodiments. Wafer thinning apparatus 200 includes a first metrology tool 202 connected to a controller 206. Controller 206 is also connected to a polishing tool 210. Polishing tool 210 is further connected to a second metrology tool 212. Second metrology tool 212 is connected to controller 206 and an etching tool 216. In some embodiments, wafer thinning apparatus 200 sequentially processes multiple wafers. The following discussion tracks the progress of wafer assembly 100 through wafer thinning apparatus 200. One of ordinary skill would recognize the process is repeatable for subsequent wafer assemblies.

First metrology tool 202 is configured to measure the initial thickness, $T_1$, of wafer layer 102 (FIG. 1A). In some embodiments, first metrology tool 202 uses Fourier transform infrared (FTIR) spectroscopy to examine wafer layer 102. After the FTIR data is obtained, the initial thickness, $T_1$, of wafer layer 102 is calculated using Beer's Law or Snell's Law. In some embodiments, first metrology tool 202 is a NOVA® 3090, a KLA-TENCOR® FX100 or other suitable metrology tool. First metrology tool 202 is configured to transmit the initial thickness, $T_1$, to a controller 206.

Figure 3:
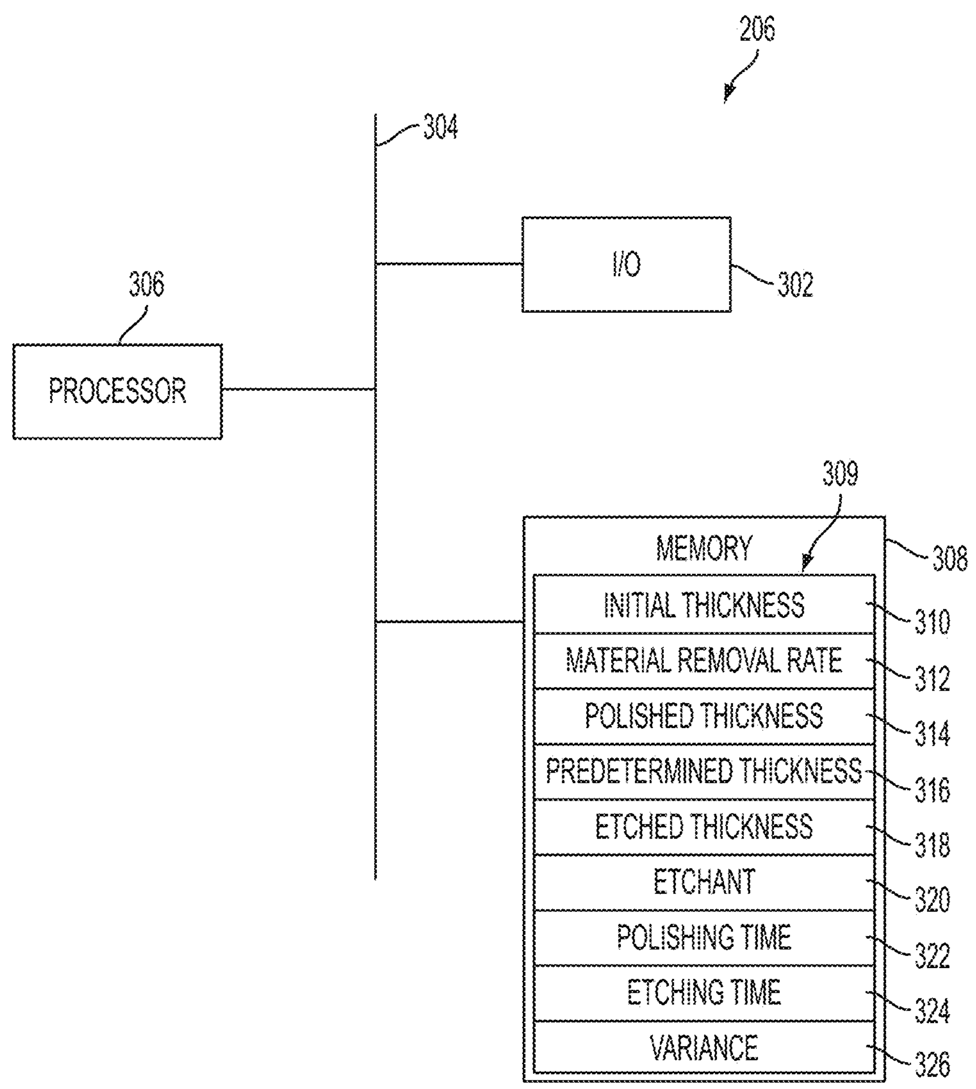
FIG. 3 is a block diagram of a controller of the wafer thinning apparatus of FIG. 2 according to one or more embodiments.

FIG. 3 is a schematic diagram of controller 206, according to one or more embodiments. Controller 206 includes an input/output (I/O) device 302 configured to receive/transmit signals from/to devices external to controller 206. I/O device 302 is connected to a processor 306 by a bus line 304. Processor 306 is configured to calculate values based on information received from I/O device 302 and information stored in a memory 308. Memory 308 is connected to I/O device 302 and processor 306 by bus line 304. Memory 308 includes a storage device 309.

Memory 308 comprises, in some embodiments, a random access memory (RAM) and/or other dynamic storage device and/or read only memory (ROM) and/or other static storage device, coupled to bus 304 for storing data and instructions to be executed by processor 306. Memory 308 is also used, in some embodiments, for storing temporary variables or other intermediate information during execution of instructions to be executed by processor 306.

Storage device 309, such as a magnetic disk or optical disk, is provided, in some embodiments, and coupled to bus 304 for storing data and/or instructions. I/O device 302 comprises an input device, an output device and/or a combined input/output device for enabling user interaction with controller 206. An input device comprises, for example, a keyboard, keypad, mouse, trackball, trackpad, and/or cursor direction keys for communicating information and commands to the processor 306. An output device comprises, for example, a display, a printer, a voice synthesizer, etc. for communicating information to a user.

In some embodiments, the processes described with respect to one or more of steps 504, 510 and 512 are realized by a processor, e.g., processor 306, which is programmed for performing such processes. One or more of the memory 308, storage 309, I/O device 302, and bus 304 is/are operable to receive design rules and/or other parameters for processing by processor 306. One or more of memory 308, storage 309, I/O device 302, and bus 304 is/are operable to output the data as determined by processor 306 at steps 504, 510 and 512.

In some embodiments, one or more of the processes is/are performed by specifically configured hardware (e.g., by one or more application specific integrated circuits or ASIC(s)) which is/are provided) separate from or in lieu of the processor. Some embodiments incorporate more than one of the described processes in a single ASIC.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

In some embodiments, storage device 309 is configured to store at least one value related to initial thickness 310, $T_1$, a material removal rate 312, a polished thickness 314, $T_2$, a predetermined thickness 316, an etched thickness 318, $T_3$, an etchant 320, a polishing time 322, an etching time 324, and a variance 326. In some embodiments, storage device 309 is configured to store values for different or additional variables.

Controller 206 is configured to calculate polishing time 322, using processor 306, based on initial thickness 310, $T_1$, predetermined thickness 316 and material removal rate 312. Initial thickness 310, $T_1$, is measurable by first metrology tool 202.

Predetermined thickness 316 is a target thickness desired after a CMP process is completed. Predetermined thickness 316 is discussed below in greater detail.

Material removal rate 312 is the speed at which polishing tool 210 removes material from wafer layer 102 by stripping material from exposed surface 102*a*. For an initial wafer assembly processed by wafer thinning apparatus 200, material removal rate 312 equals an initial material removal rate. In some embodiments, the initial material removal rate is estimated, calculated, or otherwise determined based on specifications for polishing tool 210, such as chuck and platen rotation speed, type of polishing pad, or other specifications, and a material of wafer layer 102. For example, initial material removal rate is determinable from empirical observations under a set of conditions and initial material removal rate is based on interpolation or extrapolation from these observations. In some embodiments, the initial material removal rate is input by a user.

Controller 206 is configured to calculate a difference between predetermined thickness 316 and initial thickness 310, $T_1$, and using the calculated difference and the material removal rate 312 to calculate polishing time 322. The calculated difference is a target thickness reduction of wafer layer 102 by polishing tool 210.

Wafer assembly 100, shown in FIG. 1A, is then transferred to polishing tool 210. In some embodiments, polishing tool 210 is a rotating CMP device. In other embodiments, polishing tool 210 is a linear CMP device or other suitable CMP device. In some embodiments, polishing tool 210 is an APPLIED MATERIALS® REFLEXION, REFLEXION LK, REFLEXION GT, or an EBARA® 300 SII or other suitable polishing tool.

Controller 206 is configured to transmit polishing time 322, using I/O device 302, to polishing tool 210. Polishing tool 210 is configured to receive polishing time 322 and to polish wafer assembly 100 for a duration equal to polishing time 322. Following polishing by polishing tool 210 wafer layer 102 (FIG. 1B) has polished thickness, $T_2$.

Wafer assembly 100 (FIG. 1B) is then transferred to second metrology tool 212. Second metrology tool 212 is configured to measure polished thickness 314, $T_2$, of wafer layer 102. Polished thickness 514, $T_2$, of wafer layer 102 is the thickness from exposed surface 102*a* to bonded surface 102*b* following material removal by polishing tool 210. In the embodiment of FIG. 2, first metrology tool 202 and the second metrology tool 212 are separate elements. In some embodiments, first metrology tool 202 and the second metrology tool 212 are combined into a single element. Second metrology tool 212 is configured to transmit polished thickness 314, $T_2$, to controller 206. In some embodiments, second metrology tool 212 uses FTIR spectroscopy to examine wafer layer 102. After the FTIR data is obtained, the polished thickness, $T_2$, of wafer layer 102 is calculated using Beer's Law or Snell's Law. In some embodiments, second metrology tool 212 is a NOVA® 3090, a KLA-TENCOR® FX100 or other suitable metrology tool.

Controller 206 is configured to receive polished thickness 314, using I/O 202. Processor 306 is configured to compare polished thickness 314, $T_2$, to predetermined thickness 316. A difference between polished thickness 314 and predetermined thickness 316 is used to update material removal rate 312. In some embodiments, the difference between polished thickness 314, $T_2$, and predetermined thickness 316 is divided by polishing time 322 resulting in variance 326. In some embodiments, a look-up table based on polished thickness 314, $T_2$, and predetermined thickness 316 is used to determine variance 326. In some embodiments, other calculations such as regression analysis or other numerical recipe based on polished thickness 314, $T_2$, and predetermined thickness 316 are used to determine variance 326. Variance 326 is the difference between an actual material removal rate and material removal rate 312 stored in memory 308. Controller 206 is configured to update material removal rate 312 stored in memory 308 by combining variance 326 and material removal rate 312 utilized for calculating the polishing time for a previous wafer assembly. When a subsequent wafer assembly is processed by wafer thinning apparatus 200, the updated material removal rate is used as material removal rate 312 to calculate polishing time 322 for a subsequent wafer assembly based on predetermined thickness 316 and an initial thickness of the subsequent wafer assembly.

In some embodiments, material removal rate 312 is updated following polishing of each wafer assembly 100. In some embodiments, by updating material removal rate 312 following the polishing of a wafer assembly 100, the number of wafer assemblies that pass quality control testing for a given batch is increasable as compared to less frequency updating of material removal rate 312.

Further, the material removal rate of a particular machine is changeable over time due to factors such as slurry concentration gradients or pad wear, and updating material removal rate 312 after polishing each wafer, in some instances, decreases variance 326 due to these factors.

In some embodiments, material removal rate 312 is updated based on a predefined number of wafer assemblies 100 polished since a previous updating of the material removal rate, or after a predefined elapsed time. In some embodiments, the predefined number of wafer assemblies 100 ranges from about 10 to about 30. In some embodiments, the predefined elapsed time ranges from about 2 minutes to about 30 minutes. By updating material removal rate 312 periodically, the overall processing speed is increasable as compared to more frequent updating of material removal rate 312.

In the embodiment of FIG. 2, controller 206 is connected to a single polishing tool. In some embodiments, controller 206 is connected to two or more polishing tools and independently updates the material removal rate for the polishing tools.

In some embodiments, controller 206 is configured to determine etching time 324 based on polished thickness 314 and the etching rate of etchant 320.

Etching tool 216 etches wafer layer 102 (FIG. 1B) for a duration equal to etching time 324. In some embodiments, etching tool 216 uses a wet etching process to remove material from exposed surface 102*a* of wafer layer 102. In some embodiments, etching tool 216 uses dry etching, plasma etching or another suitable etching process. In some embodiments, etchant 320 used in etching tool 216 is tetra-methyl ammonium hydroxide (TMAH). In some embodiments, etching tool 216 uses a different etchant 320, for example, a solution of hydrofluoric acid, nitric acid and acetic acid (HNA) or another suitable etchant. In some embodiments, etchant 320 is selected based on the composition of wafer layer 102.

After etching is completed, wafer layer 102 (FIG. 1C) has etched thickness 318, $T_3$.

Following the etching process, wafer assembly 100 is cleaned and measured to determine etched thickness 318, $T_3$, and the total thickness variation of wafer layer 102. In some embodiments, an additional metrology tool (not shown) is used to determine etched thickness 318 and the total thickness variation. In other embodiments, first metrology tool 202 or second metrology tool 212 is configured to determine etched thickness 318 and the total thickness variation.

In some embodiments, predetermined thickness 316 is selected to provide a desired etching time. Etching tool 216 is configured to reduce the thickness of wafer layer 102 and to remove cracks and crystal dislocations introduced by polishing tool 210. The cracks and crystal dislocations cause stress within wafer layer 102 and cause warping. For etching tool 216 to sufficiently remove cracks and dislocations, etching time 324 exceeds a time threshold. The time threshold is the time required for removing by etching tool 210 the cracks and dislocations introduced by the polishing tool 210 without removing additional material following the removal of cracks and dislocations. As etching time 324 increases beyond the time threshold, the etching process begins to introduce variations into the thickness of wafer layer 102, thereby increasing the total thickness variation. In some embodiments, these variations occur as a result of the selectivity of the etchant, gradients in etchant concentration or imperfections in the lattice structure of wafer layer 102. Predetermined thickness 316 is equal to polished thickness 314, $T_2$, when etching time 324 equals the time threshold. By updating the material removal rate of polishing tool 210, wafer thinning apparatus 200 makes it possible to reduce the difference between etching time 324 and the time threshold.

In some embodiments, the total thickness variation of wafer layer 102 (FIG. 1C) is less than about 0.15 μm. The thickness of wafer layer 102 is measured from exposed surface 102*a*, the surface furthest from carrier 104, to bonded surface 102*b*, the surface closest to carrier 104. The difference between the maximum thickness measured and the minimum thickness measured is the total thickness variation. A total thickness variation less than or equal to 0.15 μm makes it possible to reduce the amount of distortion of light passing through the wafer layer 102.

Figure 4:
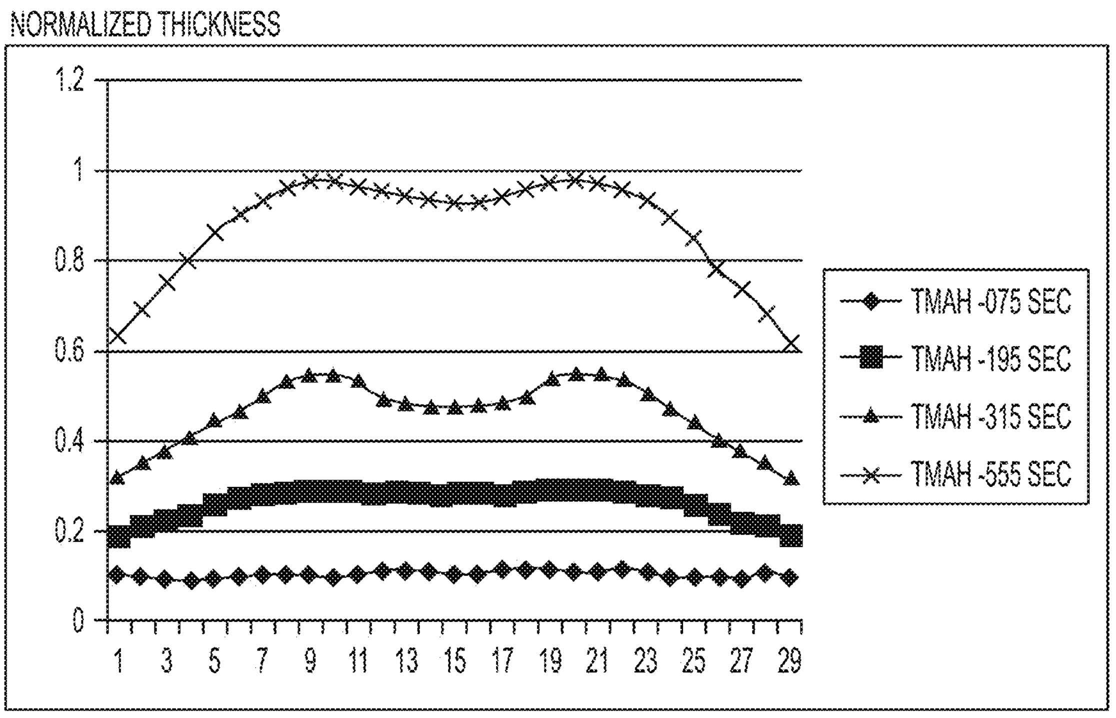
FIG. 4 is a graph of the relationship between a normalized wafer layer thickness and the position on the wafer for various etching times according to one or more embodiments.

FIG. 4 is a graph showing a relationship between etching time 324 and a normalized thickness across wafer layer 102. Points 1-29 on the x-axis of the graph of FIG. 4 are locations across wafer layer 102 of four different wafers etched for the depicted duration. Each line in FIG. 4 corresponds to an etching time of one of the four wafers. The etching time line indicated by diamond shape data points indicates the thickness at various points across wafer layer 102 for an etching time of 75 seconds. The etching time line indicated by square shape data points indicates the thickness at various points across wafer layer 102 for an etching time of 195 seconds. The etching time line indicated by triangle shape data points indicates the thickness at various points across wafer layer 102 for an etching time of 315 seconds. The etching time line indicated by x-shape data points indicates the thickness at various points across wafer layer 102 for an etching time of 555 seconds. In the embodiment of FIG. 4, etchant 320 is TMAH and wafer layer 102 is silicon. The total thickness variation is calculated by subtracting along the same etching time line of FIG. 4 the smallest thickness from the greatest thickness.

The time threshold in the embodiment of FIG. 4 is about 75 seconds. In some embodiments, the time threshold ranges from about 65 seconds to about 150 seconds. This range, in some embodiments, is narrower, e.g., from 65 seconds to 150 seconds. As indicated by the increased thickness variation as shown by the etching time lines of FIG. 4, increasing etching time 324 above the time threshold increases the total thickness variation. For example, the normalized total thickness variation for etching time 324 equal to 75 seconds is very small, as indicated by the substantially flat line, while the normalized total thickness variation for etching time 324 equal to 555 seconds is much larger as indicated by the larger variation in thickness between points 1 and 10 on the wafer.

Figure 5:
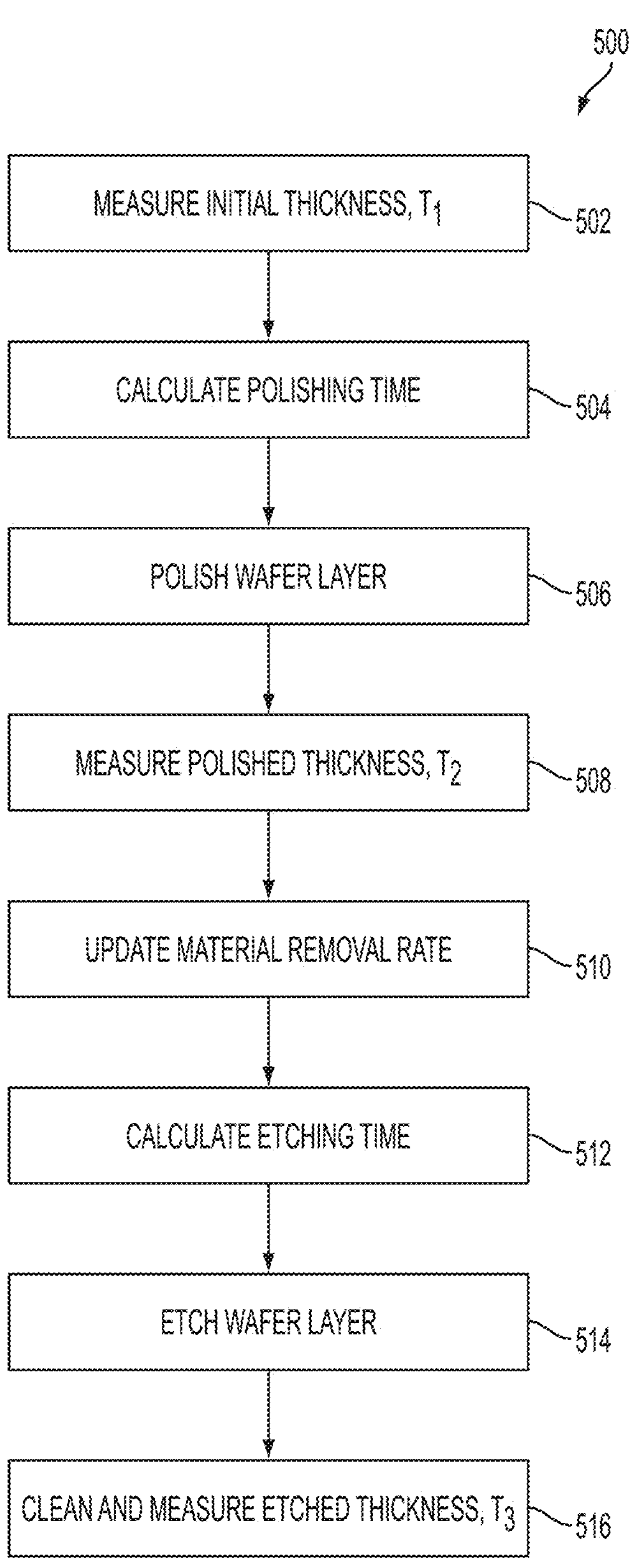
FIG. 5 is a flowchart for a method of using the wafer thinning apparatus of FIG. 2 according to one or more embodiments.

FIG. 5 is a flow chart for a method 500 of using wafer thinning apparatus 200 according to one or more embodiments. Method 500 is an iterative process performed for each wafer assembly 100 processed by wafer thinning apparatus 200. Method 500 includes measuring an initial thickness, $T_1$, in step 502. Method 500 includes calculating polishing time in step 504, and polishing wafer layer in step 506. Method 500 further includes measuring polished thickness, $T_2$, in step 508, and updating material removal rate in step 510. Method 500 further includes calculating an etching time in step 512, and etching wafer layer in step 514. Method 500 continues with cleaning wafer layer and measuring etched thickness, $T_3$, in step 516.

Method 500 begins with step 502 in which initial thickness 310, $T_1$, of wafer layer 102 is measured. In the embodiment of FIG. 2, wafer assembly 100 (FIG. 1A) is positioned in first metrology tool 202, and first metrology tool 202 measures initial thickness 310, $T_1$, of the wafer layer 102. First metrology tool 202 is configured to transmit initial thickness 310, $T_1$, to controller 206.

In step 504, polishing time 322 is calculated. In the embodiment of FIG. 2, controller 206 is configured to calculate polishing time 322 based on initial thickness 310, $T_1$, received from first metrology tool 202, predetermined thickness 316 stored in memory 308, and material removal rate 312 stored in memory 308 in a manner similar to that discussed above. In some embodiments, controller 206 is configured to transmit polishing time 322 to polishing tool 210.

In step 506, wafer layer 102 is polished. In the embodiment of FIG. 2, wafer assembly 100 (FIG. 1A) is transferred to polishing tool 210, and polishing tool 210 polishes wafer layer 102 for a duration equal to polishing time 322. After polishing is completed, wafer assembly 100 (FIG. 1B) is transferred to second metrology tool 212.

In step 508, polished thickness 314, $T_2$, of wafer layer 102 (FIG. 1B) is measured. In the embodiment of FIG. 2, second metrology tool 212 is configured to measure polished thickness 314, $T_2$. Second metrology tool 212 is configured to transmit polished thickness 314 to controller 206. Wafer assembly 100 (FIG. 1B) is transferred to etching tool 216.

In step 510, material removal rate 312 is updated. In the embodiment of FIG. 2, controller 206 is configured to update material removal rate 312 based on variance 326 and polishing time 322. In some embodiments, controller 206 updates material removal rate 312 using a linear approximation. In some embodiments, controller 206 updates material removal rate 312 using a look up table. In some embodiments, controller 206 updates material removal rate 312 using regression, interpolation, extrapolation or other suitable numerical recipes. In some embodiments, material removal rate 312 is updated after every wafer assembly 100 is polished. In some embodiments, material removal rate 312 is updated less periodically. In some embodiments, the periodicity of updating material removal rate 312 is updated based on number of wafers processed, an elapsed time, or another suitable parameter. In some embodiments, the predefined number of wafer assemblies 100 ranges from about 10 to about 30. In some embodiments, the predefined elapsed time ranges from about 2 minutes to about 30 minutes.

In step 512, etching time 324 is calculated. In some embodiments, controller 206 is configured to calculate etching time 324 based on polished thickness 314, $T_2$, and etchant 320.

In step 514, wafer layer 102 is etched. In the embodiment of FIG. 2, etching tool 216 is configured to etch wafer assembly 100 (FIG. 1B) for a duration equal to etching time 324.

In step 516, wafer assembly 100 (FIG. 1C) is then cleaned and etched thickness 318, $T_3$, is measured for quality control. Total thickness variation is also determined in step 516.

The method is described with regards to this product to highlight its utility, however, the method is suitable to uses other than the resultant products described herein.

An aspect of this description relates to a method of thinning a wafer. The method includes measuring an initial thickness of the wafer. The method further includes calculating a polishing time using the initial thickness. The method further includes polishing the wafer for a first duration equal to the polishing time to obtain a polished wafer. The method further includes measuring a polished thickness of the polished wafer.

The method further includes calculating an etching time using the polished thickness. The method further includes etching the polished wafer for a second duration equal to the etching time to obtain an etched wafer, wherein the wafer has a total thickness variation of less than or equal to 0.15 μm after etching the polished wafer. In some embodiments, measuring the initial thickness includes measuring the initial thickness using a first metrology tool. In some embodiments, measuring the polished thickness includes measuring the polished thickness using a second metrology tool different from the first metrology tool. In some embodiments, measuring the polished thickness includes measuring the polished thickness using the first metrology tool. In some embodiments, the method further includes cleaning the etched wafer. In some embodiments, etching the polished wafer includes etching the wafer for the second duration less than or equal to 75 seconds. In some embodiments, the method further includes etching a subsequent wafer for the second duration in response to the subsequent wafer being within a predetermined number of processed wafers from the polished wafer. In some embodiments, the predetermined number ranges from about 10 wafers to about 30 wafers.

An aspect of this description relates to a method of thinning a plurality of wafers. The method includes polishing a first set of wafers of a plurality of wafers for a first duration. The method further includes measuring a thickness of at least one of the first set of wafers of the plurality of wafers to determine a polished thickness of the at least one wafer of the first set of wafers of the plurality of wafers. The method further includes updating a material removal rate of the polishing process based on the measured polished thickness. The method further includes determining a second polishing time for a second set of wafers of the plurality of wafers based on the measured thickness for the second set of wafers of the plurality of wafers and based on the updated material removal rate. The method further includes calculating an etching time for each wafer of the plurality of wafers using the polished thickness of the at least one wafer. In some embodiments, the method further includes measuring an initial thickness of each wafer of the plurality of wafers; and determining the first duration based on the measured thickness for the first set of wafers of the plurality of wafers. In some embodiments, updating the material removal rate includes updating the material removal rate based on an elapsed time. In some embodiments, the elapsed time ranges from about 2 minutes to about 30 minutes. In some embodiments, updating the material removal rate includes updating the material removal rate based on a predetermined number of polished wafers. In some embodiments, the predetermined number ranges from about 10 to about 30. In some embodiments, the method further includes etching each of the plurality of wafers for the etching time. In some embodiments, etching each of the plurality of wafers includes reducing a total thickness variation of each of the plurality of wafers to less than or equal to 0.15 microns (μm).

An aspect of this description relates to a method of thinning a wafer. The method includes polishing a wafer for a first duration to reduce an initial thickness of the wafer to a polished thickness. The method further includes measuring the polished thickness. The method further includes updating a material removal rate of the polishing process based on the measured polished thickness, wherein updating the material removal rate comprises updating a lookup table. The method further includes etching the polished wafer for a second duration equal to an etching time to obtain an etched wafer, wherein the wafer has a total thickness variation of less than or equal to 0.15 μm after etching the polished wafer. In some embodiments, the method further includes measuring an initial thickness of a second wafer; and determining a second polishing time for the second wafer based on the updated material removal rate and the initial thickness of the second wafer. In some embodiments, the method further includes measuring the initial thickness of the wafer using a first metrology tool; and determining the first duration based on the measured thickness of the wafer. In some embodiments, measuring the polished thickness includes measuring the polished thickness using a second metrology tool different from the first metrology tool.

The above description discloses exemplary steps, but they are not necessarily performed in the order described. Steps can be added, replaced, changed in order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method of thinning a wafer comprising:
- measuring an initial thickness of the wafer;
- calculating a polishing time using the initial thickness;
- polishing the wafer for a first duration equal to the polishing time to obtain a polished wafer;
- measuring a polished thickness of the polished wafer;
- calculating an etching time using the polished thickness; and
- etching the polished wafer for a second duration equal to the etching time to obtain an etched wafer, wherein the wafer has a total thickness variation of less than or equal to 0.15 μm after etching the polished wafer.

2. The method of claim 1, wherein measuring the initial thickness comprises measuring the initial thickness using a first metrology tool.

3. The method of claim 2, wherein measuring the polished thickness comprises measuring the polished thickness using a second metrology tool different from the first metrology tool.

4. The method of claim 2, wherein measuring the polished thickness comprises measuring the polished thickness using the first metrology tool.

5. The method of claim 1, further comprising cleaning the etched wafer.

6. The method of claim 1, wherein etching the polished wafer comprises etching the wafer for the second duration less than or equal to 75 seconds.

7. The method of claim 1, further comprising etching a subsequent wafer for the second duration in response to the subsequent wafer being within a predetermined number of processed wafers from the polished wafer.

8. The method of claim 7, wherein the predetermined number ranges from about 10 wafers to about 30 wafers.

9. A method of thinning a plurality of wafers, the method comprising:

polishing a first set of wafers of a plurality of wafers for a first duration;

measuring a thickness of at least one of the first set of wafers of the plurality of wafers to determine a polished thickness of the at least one wafer of the first set of wafers of the plurality of wafers;

updating a material removal rate of the polishing process based on the measured polished thickness;

determining a second polishing time for a second set of wafers of the plurality of wafers based on the measured thickness for the second set of wafers of the plurality of wafers and based on the updated material removal rate; and calculating an etching time for each wafer of the plurality of wafers using the polished thickness of the at least one wafer.

10. The method of claim 9, further comprising:

measuring an initial thickness of each wafer of the plurality of wafers; and determining the first duration based on the measured thickness for the first set of wafers of the plurality of wafers.

11. The method of claim 9, wherein updating the material removal rate comprises updating the material removal rate based on an elapsed time.

12. The method of claim 11, wherein the elapsed time ranges from about 2 minutes to about 30 minutes.

13. The method of claim 9, wherein updating the material removal rate comprises updating the material removal rate based on a predetermined number of polished wafers.

14. The method of claim 13, wherein the predetermined number ranges from about 10 to about 30.

15. The method of claim 9, further comprising etching each of the plurality of wafers for the etching time.

16. The method of claim 15, wherein etching each of the plurality of wafers comprises reducing a total thickness variation of each of the plurality of wafers to less than or equal to 0.15 microns (μm).

17. A method of thinning a wafer, the method comprising:

polishing a wafer for a first duration to reduce an initial thickness of the wafer to a polished thickness;

measuring the polished thickness;

updating a material removal rate of the polishing process based on the measured polished thickness, wherein updating the material removal rate comprises updating a lookup table; and etching the polished wafer for a second duration equal to an etching time to obtain an etched wafer, wherein the wafer has a total thickness variation of less than or equal to 0.15 μm after etching the polished wafer.

18. The method of claim 17, further comprising:

measuring an initial thickness of a second wafer; and determining a second polishing time for the second wafer based on the updated material removal rate and the initial thickness of the second wafer.

19. The method of claim 17, further comprising:

measuring the initial thickness of the wafer using a first metrology tool; and determining the first duration based on the measured thickness of the wafer.

20. The method of claim 19, wherein measuring the polished thickness comprises measuring the polished thickness using a second metrology tool different from the first metrology tool.

* * * * *